United States Patent
Grip

(10) Patent No.: US 10,067,583 B2
(45) Date of Patent: Sep. 4, 2018

(54) VIRTUAL BORDERLESS DISPLAY

(71) Applicant: Sony Corporation, Tokyo (JP)

(72) Inventor: Martin Grip, Höllviken (SE)

(73) Assignees: Sony Corporation, Tokyo (JP); Sony Mobile Communications Inc., Tokyo (JP)

( * ) Notice: Subject to any disclaimer, the term of this patent is extended or adjusted under 35 U.S.C. 154(b) by 142 days.

(21) Appl. No.: 14/673,955

(22) Filed: Mar. 31, 2015

(65) Prior Publication Data

US 2016/0291745 A1    Oct. 6, 2016

(51) Int. Cl.
| | |
|---|---|
| G06F 3/041 | (2006.01) |
| G02F 1/1333 | (2006.01) |
| G02F 1/1345 | (2006.01) |
| G09F 9/30 | (2006.01) |
| G04G 21/08 | (2010.01) |
| H05K 1/14 | (2006.01) |

(52) U.S. Cl.
CPC ........ G06F 3/0412 (2013.01); G02F 1/13338 (2013.01); G02F 1/13452 (2013.01); G04G 21/08 (2013.01); G06F 3/041 (2013.01); G09F 9/30 (2013.01); G06F 2203/04102 (2013.01); H05K 1/147 (2013.01); H05K 2201/10128 (2013.01)

(58) Field of Classification Search
CPC ........ G06F 3/0412; G06F 2203/04102; G06F 3/041; G04G 21/08; G09F 9/30; G02F 1/13338; G02F 1/13452; H05K 2201/10128; H05K 1/147

See application file for complete search history.

(56) References Cited

U.S. PATENT DOCUMENTS

| | | | |
|---|---|---|---|
| 5,553,299 A | 9/1996 | McPherson | |
| 5,675,396 A * | 10/1997 | Tsunehiro | ........... G02F 1/13452 349/149 |
| 6,661,399 B1 | 12/2003 | Oh et al. | |
| 8,275,327 B2 | 9/2012 | Yi et al. | |

(Continued)

FOREIGN PATENT DOCUMENTS

WO    2014/054418 A1    4/2014

OTHER PUBLICATIONS

International Search Report and Written Opinion from counterpart International Patent Application No. PCT/US2015/057654, dated Jan. 22, 2016.

(Continued)

*Primary Examiner* — Srilakshmi K Kumar
*Assistant Examiner* — Brent D Castiaux
(74) *Attorney, Agent, or Firm* — Tucker Ellis LLP

(57) ABSTRACT

A display comprising a display panel, wherein the display panel comprises two or more bonding areas; a driver configured to drive the display panel; a layer that provides a medium via which signals can propagate to and from the driver, and wherein the driver is mounted to the layer; and two or more flexible connectors, wherein the two or more flexible connectors provide communication paths between the display panel and the driver, and wherein a first end of each of the two or more flexible connectors connects to the display panel at a corresponding one of the two or more bonding areas, and wherein a second end of each of the two or more flexible connectors connects to the driver via the layer.

18 Claims, 13 Drawing Sheets

(56) References Cited

U.S. PATENT DOCUMENTS

| | | | |
|---|---|---|---|
| 8,390,757 B2 | 3/2013 | Kim et al. | |
| 8,432,523 B2 | 4/2013 | Shin et al. | |
| 8,773,847 B2 | 7/2014 | Byun et al. | |
| 2004/0090584 A1 | 5/2004 | Mai | |
| 2005/0179850 A1 | 8/2005 | Du | |
| 2008/0057679 A1* | 3/2008 | Nakadate | H01L 21/78 438/462 |
| 2008/0111950 A1 | 5/2008 | Hong | |
| 2010/0134743 A1* | 6/2010 | Shin | G02F 1/13 349/143 |
| 2012/0098774 A1 | 4/2012 | Hideaki | |
| 2012/0287066 A1* | 11/2012 | Yang | G06F 1/1626 345/173 |
| 2013/0070181 A1* | 3/2013 | Son | G02F 1/1345 349/61 |
| 2013/0088671 A1 | 4/2013 | Drzaic et al. | |
| 2013/0181951 A1* | 7/2013 | Klinghult | G06F 3/0416 345/177 |
| 2013/0328051 A1 | 12/2013 | Franklin | |
| 2014/0063393 A1 | 3/2014 | Zhong et al. | |
| 2014/0098055 A1 | 4/2014 | Suk-Ho | |
| 2014/0347318 A1 | 11/2014 | Kim | |
| 2014/0362544 A1 | 12/2014 | Han et al. | |
| 2015/0012877 A1 | 1/2015 | Lee et al. | |

OTHER PUBLICATIONS

International Search Report and Written Opinion from counterpart International Patent Application No. PCT/US2015/038036, dated Sep. 30, 2015.

International Search Report and Written Opinion from corresponding International Application No. PCT/US2015/052527, dated Nov. 12, 2015.

* cited by examiner

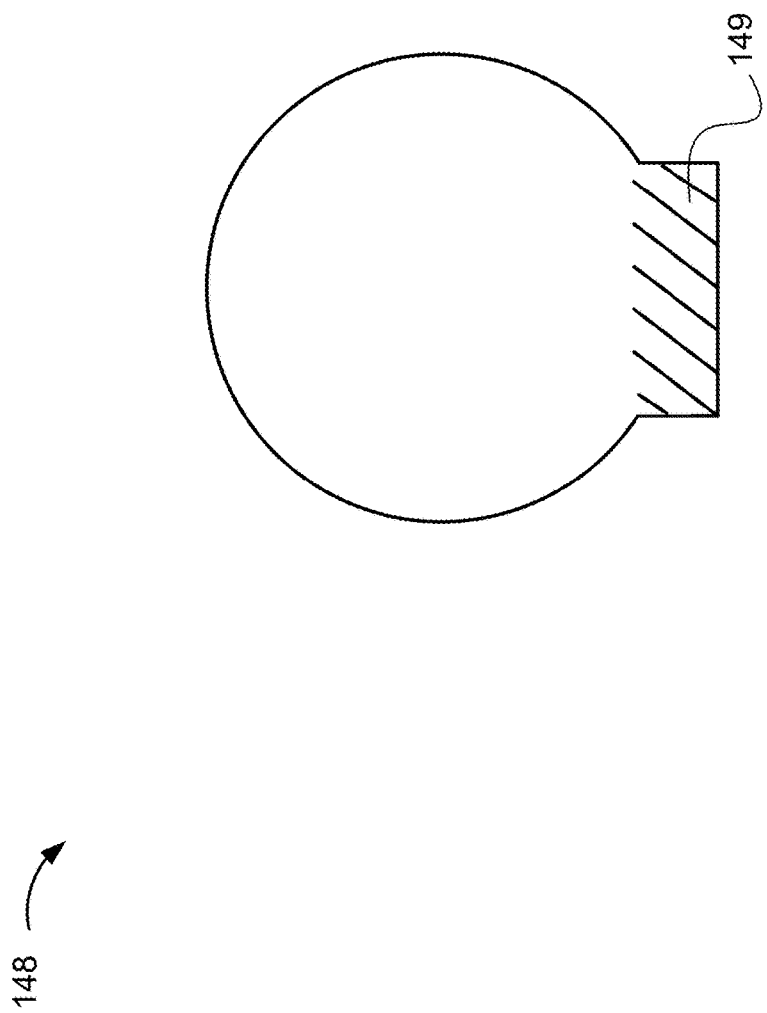

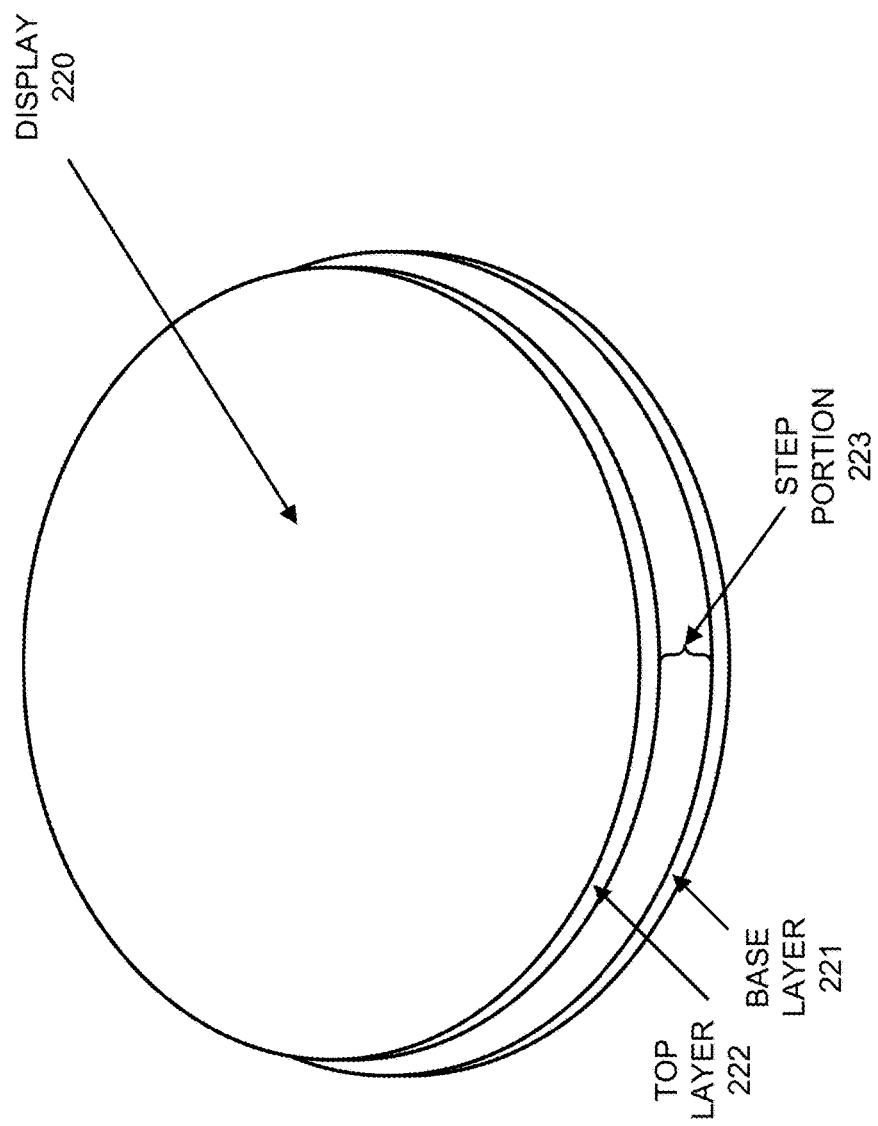

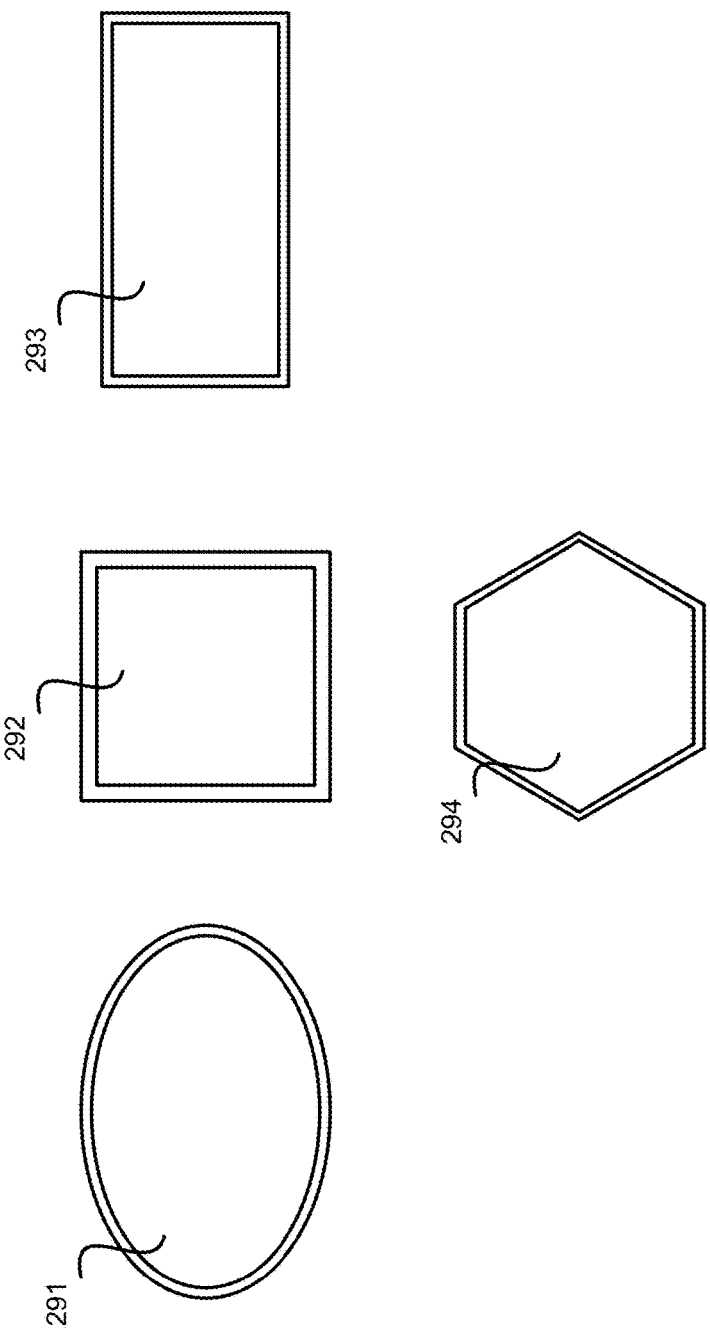

VIRTUAL BORDERLESS DISPLAY

BACKGROUND

A device, such as a mobile device or a wearable device, offers various services to its user. Users may interact with the displays of these devices via touch panels and/or touchless panels. While touch and touchless input technologies allow users a great deal of flexibility when operating these devices, designers and manufacturers are continually striving to improve the qualities of the displays.

SUMMARY

According to one aspect, a display may comprise a display panel, wherein the display panel comprises two or more bonding areas; a driver configured to drive the display panel; a layer that provides a medium via which signals can propagate to and from the driver, and wherein the driver is mounted to the layer; and two or more flexible connectors, wherein the two or more flexible connectors provide communication paths between the display panel and the driver, and wherein a first end of each of the two or more flexible connectors connects to the display panel at a corresponding one of the two or more bonding areas, and wherein a second end of each of the two or more flexible connectors connects to the driver via the layer.

According to another aspect, a user device may comprise a display panel, wherein the display panel comprises two or more bonding areas; a driver configured to drive the display panel; a layer that provides a medium via which signals can propagate to and from the driver, and wherein the driver is mounted to the layer; and two or more flexible connectors, wherein the two or more flexible connectors provide communication paths between the display panel and the driver, and wherein a first end of each of the two or more flexible connectors connects to the display panel at a corresponding one of the two or more bonding areas, and wherein a second end of each of the two or more flexible connectors connects to the driver via the layer. The user device may further comprise a memory, wherein the memory stores software; and a processor, wherein the processor is configured to execute the software.

According to yet another aspect, a touch display may comprise a touch panel operable in at least one of an on-touch mode or a touchless mode; a display panel, wherein the display panel comprises two or more bonding areas; a driver configured to drive the display panel; a layer that provides a medium via which signals can propagate to and from the driver, and wherein the driver is mounted to the layer; and two or more flexible connectors, wherein the two or more flexible connectors provide communication paths between the display panel and the driver, and wherein a first end of each of the two or more flexible connectors connects to the display panel at a corresponding one of the two or more bonding areas, and wherein a second end of each of the two or more flexible connectors connects to the driver via the layer.

DESCRIPTION OF THE DRAWINGS

FIGS. 1B through 1D illustrate top-side views of exemplary displays in which display active areas are limited due to display inactive areas;

FIG. 2B illustrates an elevational view of an exemplary display;

FIG. 2G illustrates differently-shaped virtual borderless displays;

DETAILED DESCRIPTION OF PREFERRED EMBODIMENTS

The following detailed description refers to the accompanying drawings. The same reference numbers in different drawings may identify the same or similar elements.

Figure 1A:
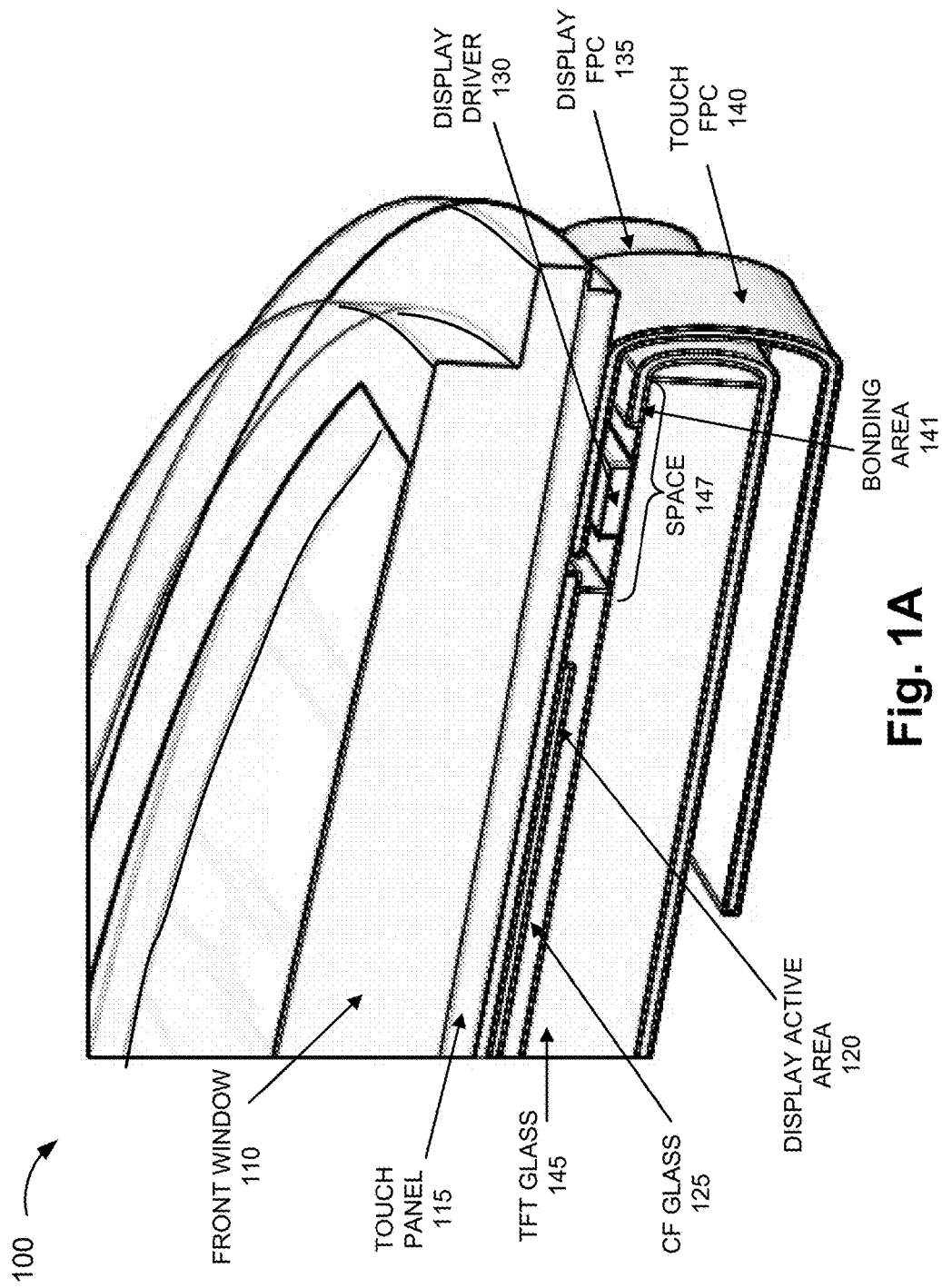
FIG. 1A illustrates a cross-sectional view of an exemplary display configuration of various components of a display.

A configuration for a display, which may be a touch display and/or a touchless display (simply referred to herein as "display"), can limit the possibilities of shape and/or size of certain components of the display. For example, an active area of the display may be restricted in terms of shape and available size in view of the configuration and/or architecture of the display. By way of further example, FIG. 1A illustrates an exemplary display configuration 100 of various components of a display. As illustrated, display configuration 100 comprises a front window 110, a touch panel 115, a display active area 120, a color filter (CF) glass 125, a display driver 130, a display flexible printed circuit (FPC) 135, a touch flexible printed circuit (FPC) 140, a bonding area 141, and a thin-film transistor (TFT) glass 145.

According to display configuration 100, display active area 120 is limited in terms of shape and/or size since a space 147 is needed for display driver 130 and bonding area 141, which bonds display FPC 135 to thin-film transistor (TFT) glass 145. In this way, display signals are routed to a dedicated display driver area. However, as a result of this configuration, the allocated space 147 for these components (e.g., display driver 130, bonding area 141, etc.) prevents display active area 120 extending further towards the edge of thin-film transistor glass 145.

Figure 1D:
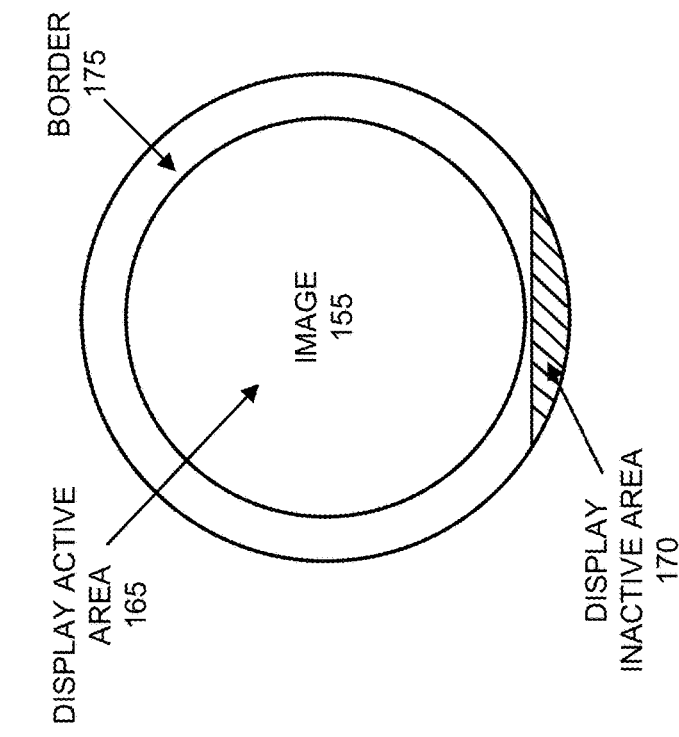
Figure 1C:
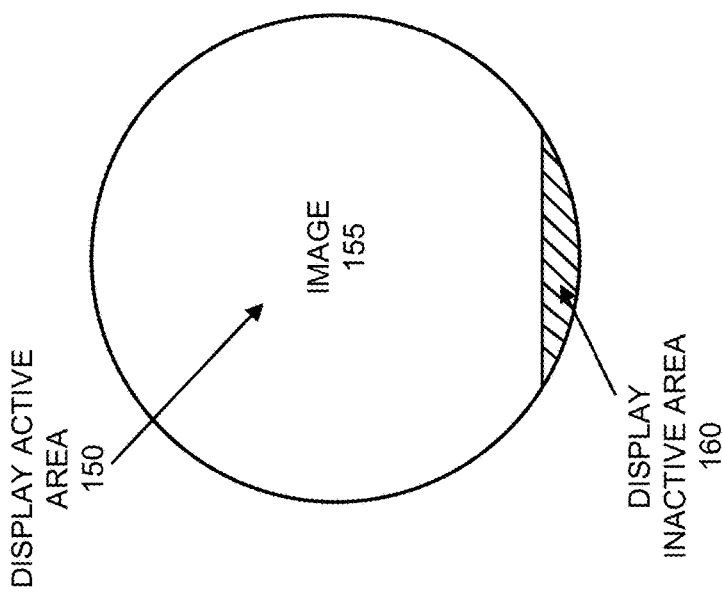

In view of this or similar configuration, which may include a display other than an LCD display, display active area 120 is limited. For example, FIG. 1B illustrates a top-side view of an exemplary display 148 in which an area 149 is designed to place a display driver and a display flexible printed circuit for connection with the display driver (not illustrated). FIG. 1C illustrates a top-side view of an exemplary display. As illustrated, a display active area 150 is limited due to a display inactive area 160 (e.g., where display driver 130, etc. resides). In this regard, an image 155 displayed within display active area 150 has a non-circular active area. Similarly, FIG. 1D illustrates a top-side view of another exemplary display. As illustrated, a display active area 165 is reduced (relative to display active area 150 of FIG. 1C) to allow for a display inactive area 170 (e.g., where display driver 130, etc. resides). In this regard, a border 175 serves as a disguise (from a user's perspective) for display inactive area 170 and provides a (smaller) circular display active area 165.

According to an exemplary embodiment, a display configuration increases an area of display active area for use relative to a total area of the display active area. According to an exemplary embodiment, a driver is mounted to or situated on a system and not a display panel. According to an exemplary implementation, the driver is mounted to or situated on a backside or underside of the system. According to an exemplary embodiment, the driver is connected to the system. According to an exemplary embodiment, the driver comprises a display driver. According to another exemplary embodiment, the driver comprises a display driver and a touch driver.

According to an exemplary embodiment, the system comprises a substrate or a layer of material which allows signals to propagate. For example, multiple flexible connectors may connect to the display panel and the system. The system routes signals to and/or from the multiple flexible connectors and to and/or from the driver (e.g., a display driver). Additionally, for example, one or multiple flexible connectors may connect to a touch panel and the system. The system routes signals to and/or from the one or multiple flexible connectors and to and/or from the driver (e.g., a touch driver). According to an exemplary embodiment, the system routes signals to and/or from a host printed circuit board. According to an exemplary implementation, the system may be a driver glass (e.g., glass panel, chip-on-glass, etc.), a flexible printed circuit (FPC), a chip-on-flex, a printed circuit board (PCB), or other type of substrate that allows the propagation of signals.

According to an exemplary implementation, the display panel may be a liquid crystal display (LCD). According to other exemplary implementations, the display panel may be implemented using other display technologies, such as, for example, color super twisted nematic (CSTN), thin film diode (TFD), organic light-emitting diode (OLED), active-matrix OLED (AMOLED), or some other conventional or known display technology (e.g., an electrophoretic display, etc.).

According to an exemplary embodiment, the display panel provides multiple bonding areas to permit multiple connections between the display panel and the multiple flexible connectors. According to an exemplary implementation, the display panel comprises a step configuration in which a step portion of the display panel is used to provide the multiple bonding areas. According to such an implementation, the multiple flexible connectors connect to the display panel at the multiple bonding areas and wrap towards the system to which the driver is connected. According to an exemplary embodiment, one or multiple flexible connectors connect a touch panel, a touchless panel, or a touch and touchless panel (hereinafter simply referred to as a "touch panel"). For example, the touch panel provides one or multiple bonding areas to permit the connection(s). The touch flexible connector also wraps toward the system to which the driver is connected.

Figure 2A:
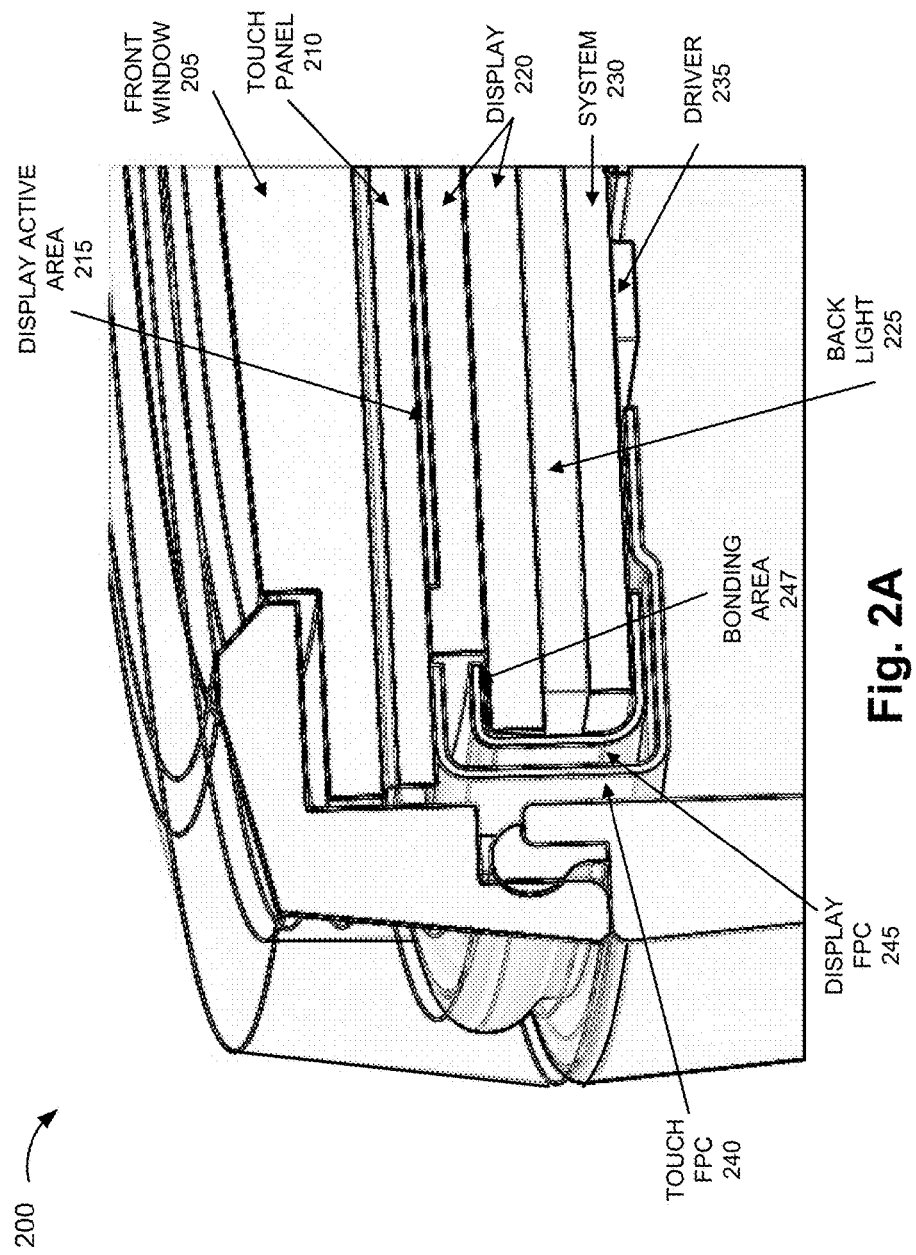
FIG. 2A illustrates a cross-sectional view of an exemplary display configuration in which exemplary embodiments of a virtual borderless display may be implemented.

FIG. 2A illustrates a cross-sectional view a display configuration 200 in which exemplary embodiments of a virtual borderless display may be implemented. As illustrated, display configuration 200 of a display comprises a front window 205, a touch panel 210, a display active area 215, a display 220, a backlight 225, a system 230, a driver 235, a touch FPC 240, and a display FPC 245.

According to other embodiments, display configuration 200 may include additional components or layers, fewer components or layers, different components or layers, and/or a different arrangement of components or layers. For example, according to another embodiment, display configuration 200 may not include touch panel 210 and touch FPC 240. Additionally, or alternatively, display configuration 200 may not include backlight 225. According to other embodiments, display configuration 200 may include additional components or layers, such as a polarizer, etc. Additionally, although FIG. 2A illustrates a single display FPC 240, as illustrated in other figures and described further below, display configuration 200 comprises multiple display FPCs 240.

Front window 205 comprises a transparent layer of display configuration 200 through which a user may see visual elements (e.g., graphics, etc.) that are displayed. In addition to being a clear layer, front window 205 may act as a protective covering. For example, front window 205 may be oil resistant (e.g., oil on a human's finger), scratch or abrasion resistant, etc. Front window 205 may be implemented as a film or coating. For example, front window 205 may be implemented as tempered glass or a plastic layer.

Touch panel 210 comprises a device that senses the touch of a user and/or an instrument (e.g., a stylus, gloved touch, etc.). Touch panel may use one or multiple sensing technologies, such as, for example, capacitive sensing (e.g., resistive, projected, etc.), surface acoustic wave (SAW) sensing, resistive sensing, optical sensing, pressure sensing, infrared sensing, acoustic sensing, and/or gesture sensing. Touch panel 210 may detect a single-point input, a multi-point input, etc. Additionally, or alternatively, touch panel 210 comprises a device that senses air-touch and air-gestures of the user and/or an instrument. In this regard, touch panel 210 may be operable in an on-touch and/or touchless mode.

Display active area 215 comprises a portion of the total display area occupied by pixels. Display 220 comprises a display. For example, display 220 may be implemented as a liquid crystal display (LCD), a plasma display panel (PDP), a field emission display (FED), or some other type of display technology (e.g., organic light-emitting diode (OLED), active matrix OLED (AMOLED), an electrophoretic display, etc). Display 220 can present to a user various types of graphics, such as displaying text, pictures, video, and various images (e.g., icons, objects, etc.). Backlight 225 comprises a device that produces light. For example, a display, such as an LCD may require backlight 225. As previously described, since display configuration 200 may comprise various types of displays, backlight 225 is an optional component of display configuration 200. For example, if display 220 comprises an OLED, display configuration 200 may not comprise backlight 225.

System 230 comprises a medium via which signals may propagate. For example, the signals may include display signals, touch signals, control signals, power supply signals, or other types of signals that may contribute to the operation of a component included in display configuration 200. System 230 may also comprise other forms of components. As an example, system 230 may comprise a processor, an analog-to-digital converter, a microchip to enable communication with a main processing system, etc. By way of example, system 230 may be implemented as a flexible printed circuit, a chip-on-flex, a glass panel (e.g., a driver glass, a chip-on-glass, etc.), a printed circuit board, or other type of substrate that allows the propagation of signals. According to an exemplary embodiment, system 230 connects to driver 235. According to an exemplary embodiment, system 230 connects to touch FPC 240, which in turn connects to touch panel 210. Additionally, according to an exemplary embodiment, system 230 connects to display FPC 245, which in turn connects to display 220. Based on these connections, system 230 enables correct routing of all signals from touch FPC 240 and display FPC 245 to driver 235. According to an exemplary embodiment, system 230 connects to a host printed circuit board (e.g., a main processing system of a user device) (not illustrated).

Driver 235 comprises a display driver or a display driver and a touch driver. For example, driver 235 may comprise a register-based microprocessor. The display driver drives display 220 and the touch driver drives touch panel 210. Touch FPC 240 carries touch signals from touch panel 210 to driver 235. Display FPC 245 carries display signals from display 220 to driver 235. According to an exemplary implementation, display FPC 245 may be a flexible printed circuit, a chip-on-flex, a chip-on-foil, or some other flexible material that can propagate signals. Touch FPC 240 may be implemented in a similar manner.

As illustrated, a bonding area 247 connects display FPC 245 to display 220. For example, a connection between display 220 and display FPC 245 may be implemented by way of heat sealing display FPC 245 to display 220 at bonding area 247. Additionally, for example, epoxy glue may be added between display FPC 245 and display 220 to provide reliability (e.g., so display FPC 245 is adhered securely). In this way, bonding area 247 provides a connection between display FPC 245 and display 220 and permits signals to be routed. Additionally, driver 235 is mounted to the backside or underside of system 230. As a result, display active area 215 is less restricted in terms of size and/or shape since driver 235 is not mounted on display 220 and, as described further below, multiple display FPCs 245 may be used to route display signals to driver 235.

FIG. 2B illustrates an elevational view of an exemplary display 220. As illustrated, display 220 has a circular configuration comprising a base layer 221 and a top layer 222. For example, when display 220 is an LCD, base layer 221 may comprise a TFT layer and top layer 222 may comprise a color filter layer. According to another example, when display 220 is an OLED, base layer 221 may comprise a TFT layer, and top layer 222 may comprise an encapsulation layer. According to yet another example, when display is an electrophoretic display, base layer 221 may comprise a TFT layer and top layer 222 may comprise an encapsulation layer. Since this description is not intended to provide an exhaustive treatment of every display technology that may be implemented, as well as the layers, materials, configuration, etc. associated with every display technology, the exemplary display technologies described above, such as LCD, OLED, electrophoretic, etc., may include additional layers, different layers, and/or a different arrangement of layers than those specifically described herein. Since base layer 221 has a larger circular shape than top layer 222, a step portion 223 is formed. Although not entirely illustrated, step portion 223 is present around the entire perimeter. According to other embodiments, display 220 may have a different configuration, such as elliptical, square, rectangular, triangular, or other type of three-dimensional shape. Additionally, or alternatively, display 220 may comprise another type of configuration that provides a similarly functioning bonding area 247.

Figure 2C:
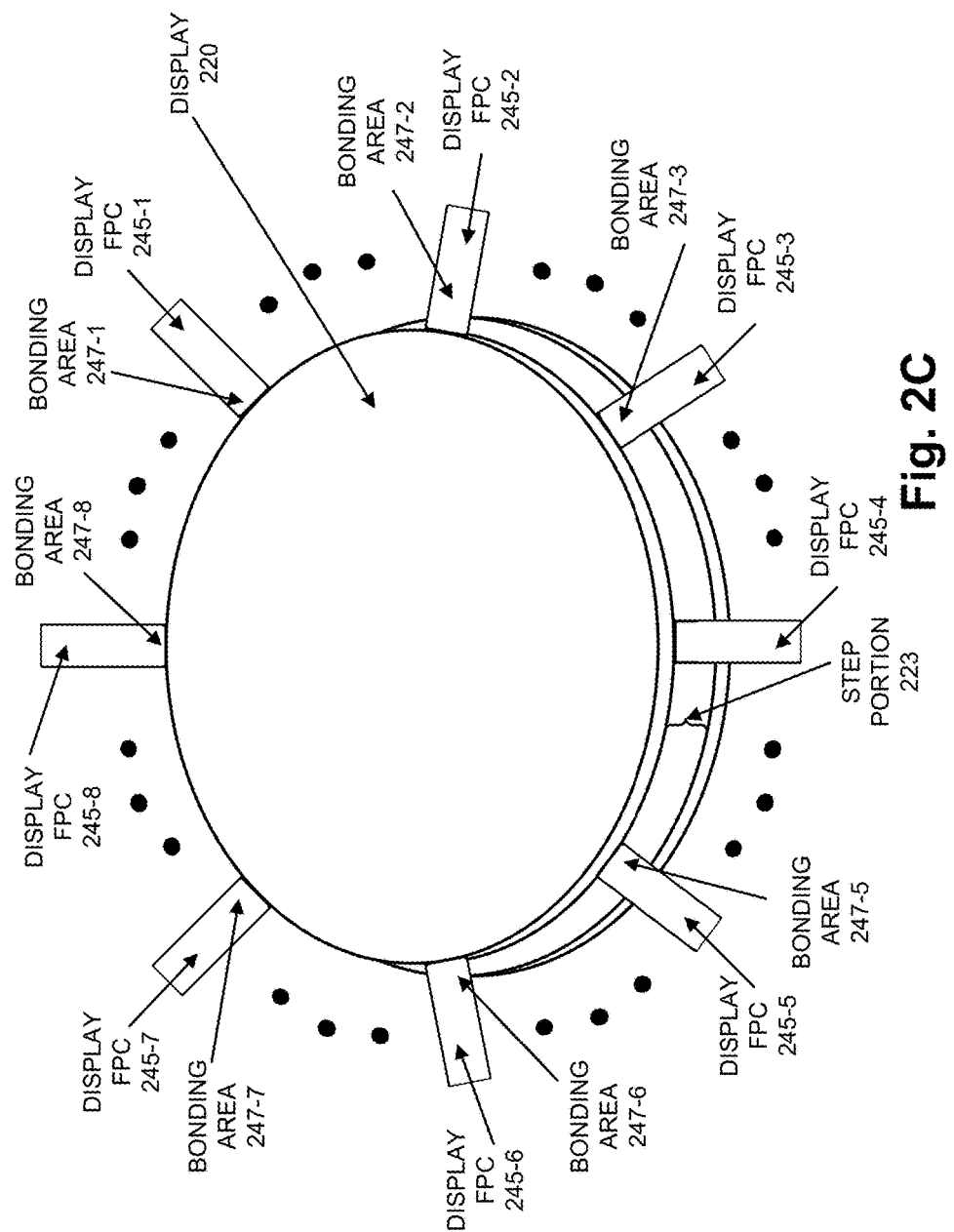
FIGS. 2C and 2D illustrate elevational views of an exemplary display and display flexible printed circuit connection configuration.
Figure 2D:
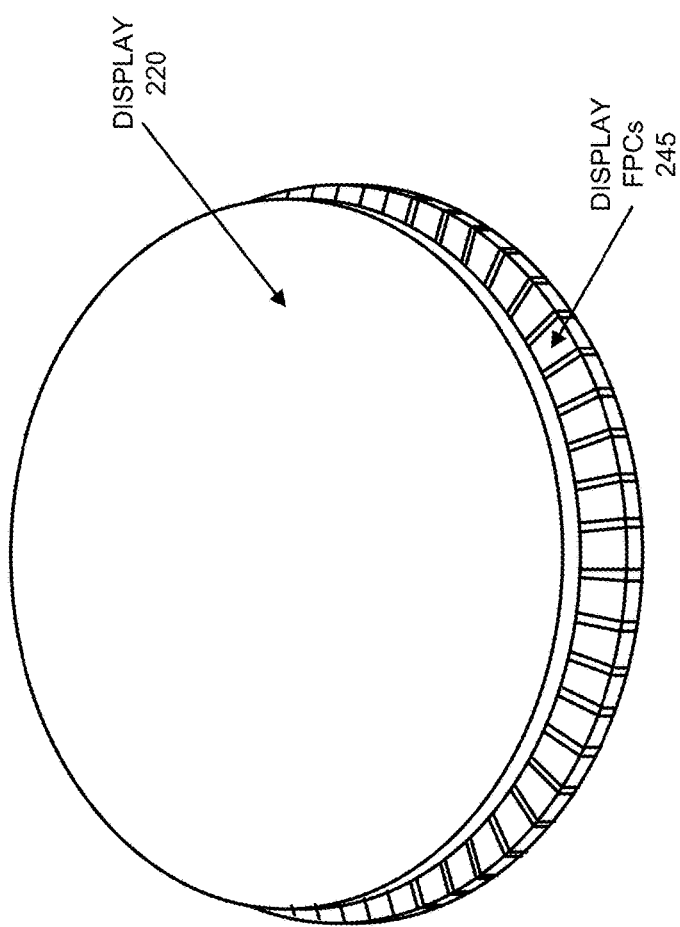

FIGS. 2C and 2D illustrate elevational views of an exemplary configuration of display 220 and display FPCs 245 connections. As illustrated, display FPC 245-1 through display FPC 245-8 (also referred to collectively as display FPCs 245 and generally or individually as display FPC 245) connect to display 220 at bonding areas 247-1 through 247-8 (also referred to collectively as bonding areas 247 or generally or individually as bonding area 247). The number of display FPCs 245 and bonding areas 247 are exemplary. According to other embodiments, a larger number or a fewer number of display FPCs 245 and bonding areas 247 may be implemented. Additionally, or alternatively, the placement and/or positioning of display FPCs 245 and bonding areas 247 are exemplary. According to other embodiments, the placement and/or positioning of display FPCs 245 and bonding areas 247 may be implemented differently. For example, as indicated by the ellipses in FIG. 2C, the number and/or placement of display FPCs 245 and bonding areas 247 may be greater or fewer, and situated anywhere around the perimeter of top layer 222. According to this configuration, in contrast to the configuration depicted in FIG. 1A in which display driver 130 is located on the display (e.g., a thin-film transistor glass 145), driver 235 is not located on display 220.

Referring to FIG. 2D, display FPCs 245 may be folded or wrapped around display 220 towards driver 235. Purely for illustrative purposes, the number and placement of display FPCs 245 are different than the number and placement of display FPCs 245 depicted in FIG. 2C.

Figure 2E:
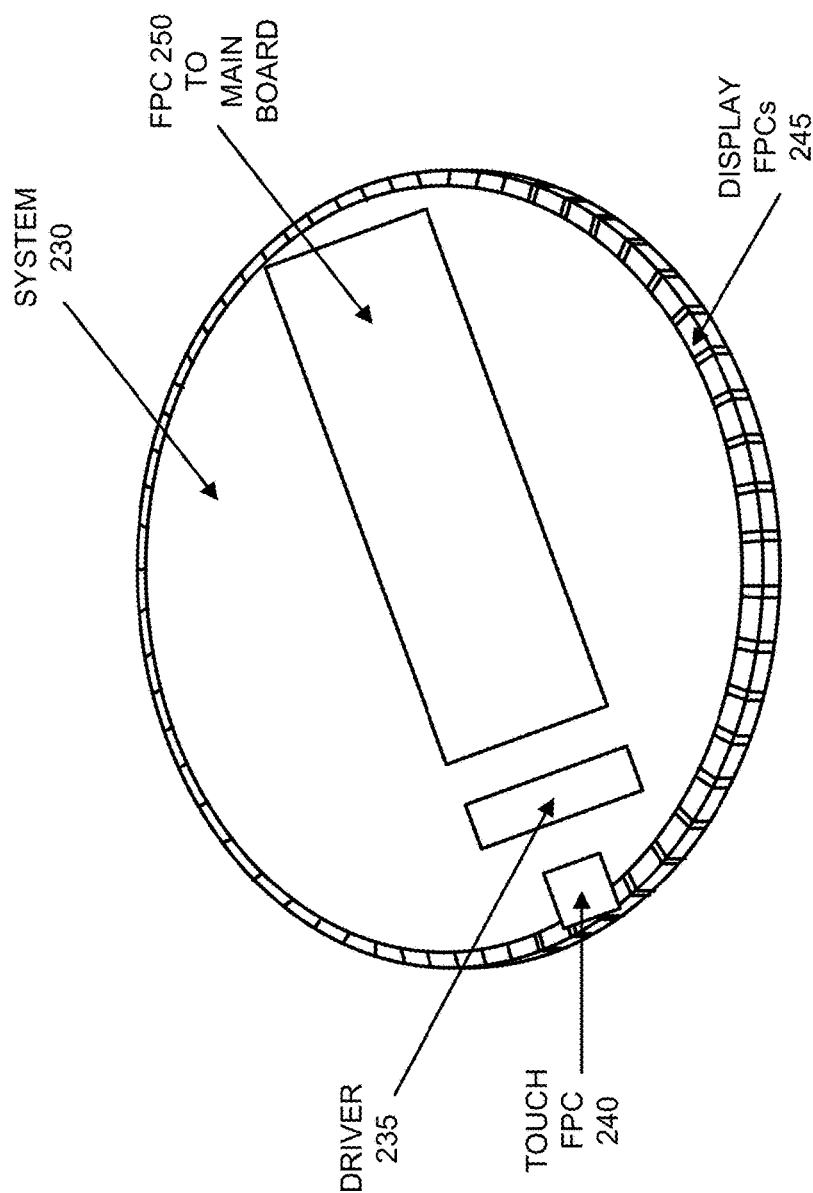
FIG. 2E illustrates a bottom-side view of the display configuration.

FIG. 2E illustrates a bottom-side view of display configuration 200. Referring to FIGS. 2C through 2E, display FPCs 245 connect to system 230. System 230 may be attached (e.g., laminated, etc.) to backlight 225 or a backlight frame (when present—not illustrated) or display 220 (e.g., base layer 221) when backlight 225 is omitted (e.g., for display technologies that do not require a backlight). Driver 235 is connected to system 230. Although not illustrated, display FPCs 245 are connected to driver 235. Touch FPC 240 also connects to driver 235. Additionally, a different FPC 250 may connect driver 235 to a main board or a main processing system of a device that comprises display configuration 200.

Figure 2F:
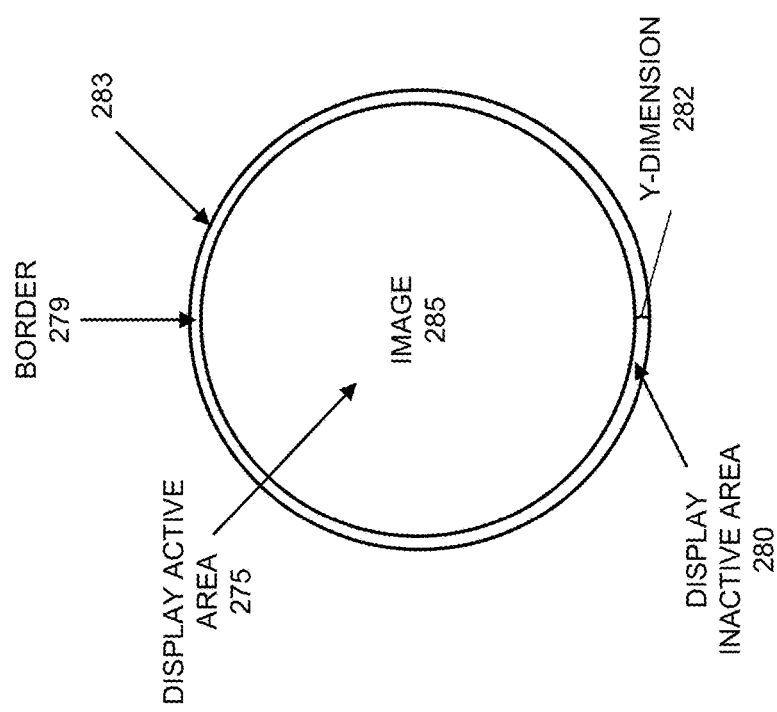
FIG. 2F illustrates a top-side view of a virtual borderless display.

FIG. 2F illustrates a top-side view of a virtual borderless display. As illustrated, relative to FIGS. 1C and 1D, a display active area 275 is less restricted in terms of size and/or shape. For example, a display inactive area 280 (e.g., where display FPCs 245 are connected to display 220) can be configured such that a border 279 of the display provides a (larger) circular display active area 275 relative to FIG. 1D. Thus, by virtue of a y-dimension 282 being reduced, an image 285 can be presented via a larger and, in this case circular, display area. By way of example, referring to FIG. 2B, step portion 223 constitutes display inactive area 280. Similarly, as previously illustrated in FIG. 1D, border 279 is analogous to border 175 in which a perimeter 283 constitutes the outer dimension of the display. For round or circular displays, for example, the less wide each display FPC 245 is due to the multiplicity of display FPCs 245 implemented, the smaller border 279 becomes and the larger display active area 275 becomes.

As previously described, display configuration 200 may be implemented to provide displays having various shapes, other than circular, and may increase the display active area of the displays being used. By way of further example, and referring to FIG. 2G, display configuration 200 may be implemented on an elliptical display 291, a square display 292, a rectangular display 293, and a hexagonal display 294. Since this description is not intended to provide an exhaustive list of possible shapes of a display, shapes other than those specifically described and illustrated may be implemented.

Figure 3:
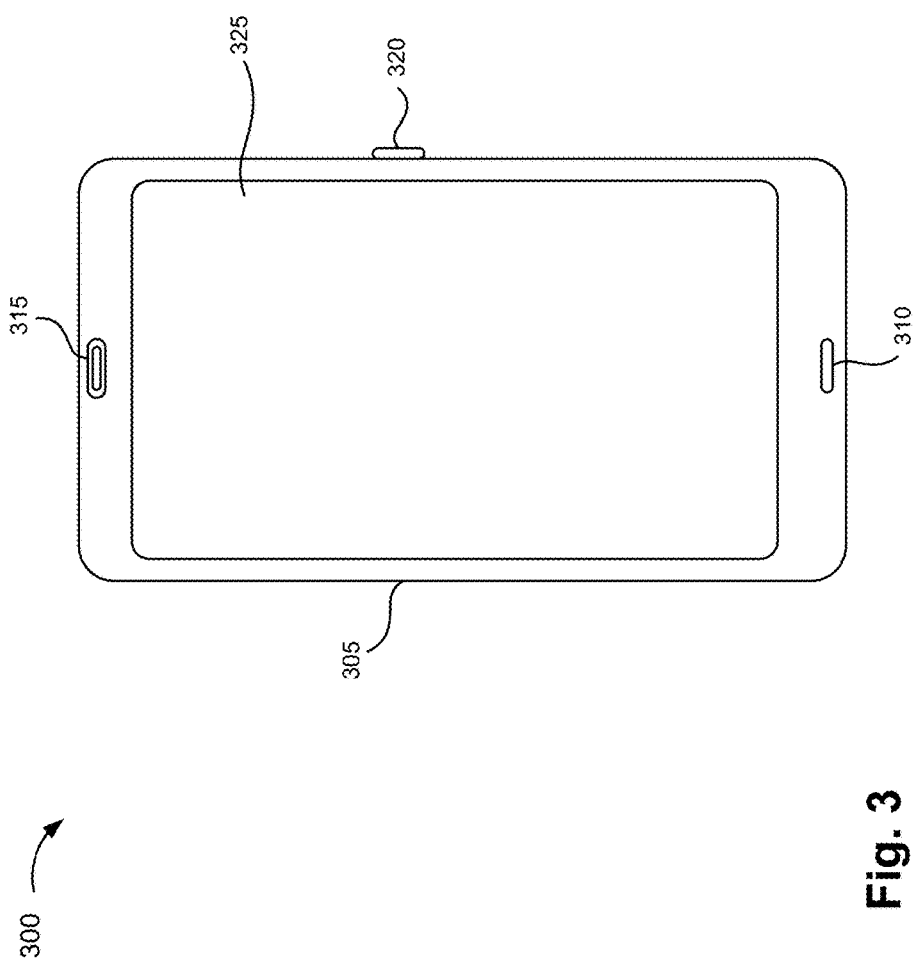
FIG. 3 illustrates an exemplary user device in which an embodiment of the virtual borderless display may be implemented.

Additionally, display configuration 200 may be implemented for various types of user devices. FIG. 3 illustrates an exemplary user device 300 in which an embodiment of the virtual borderless display may be implemented. While illustratively speaking based on FIG. 3, user device 300 may be representative of, for example, a smartphone, a cellphone, or a personal digital assistant (PDA), user device 300 may be implemented as various other types of user devices. For example, user device 300 may take the form of a tablet device, a data organizer, a picture capturing device, a video capturing device, a Web-access device, a computer, a palm-top device, a netbook, a gaming device, a location-aware device, a music playing device, a television, or some other type of consumer device that comprises a display. Alternatively, user device 300 may be implemented as a non-consumer device, a non-mobile device, or any other form of an electronic device. As illustrated in FIG. 3, user device 300 comprises a housing 305, a microphone 310, a speaker 315, a button 320, and a display 325. Display 325 may be implemented based on display configuration 200, as described herein. According to other embodiments, user device 300 may comprise fewer components, additional components, different components, and/or a different arrangement of components than those illustrated in FIG. 3 and described herein.

Figure 4:
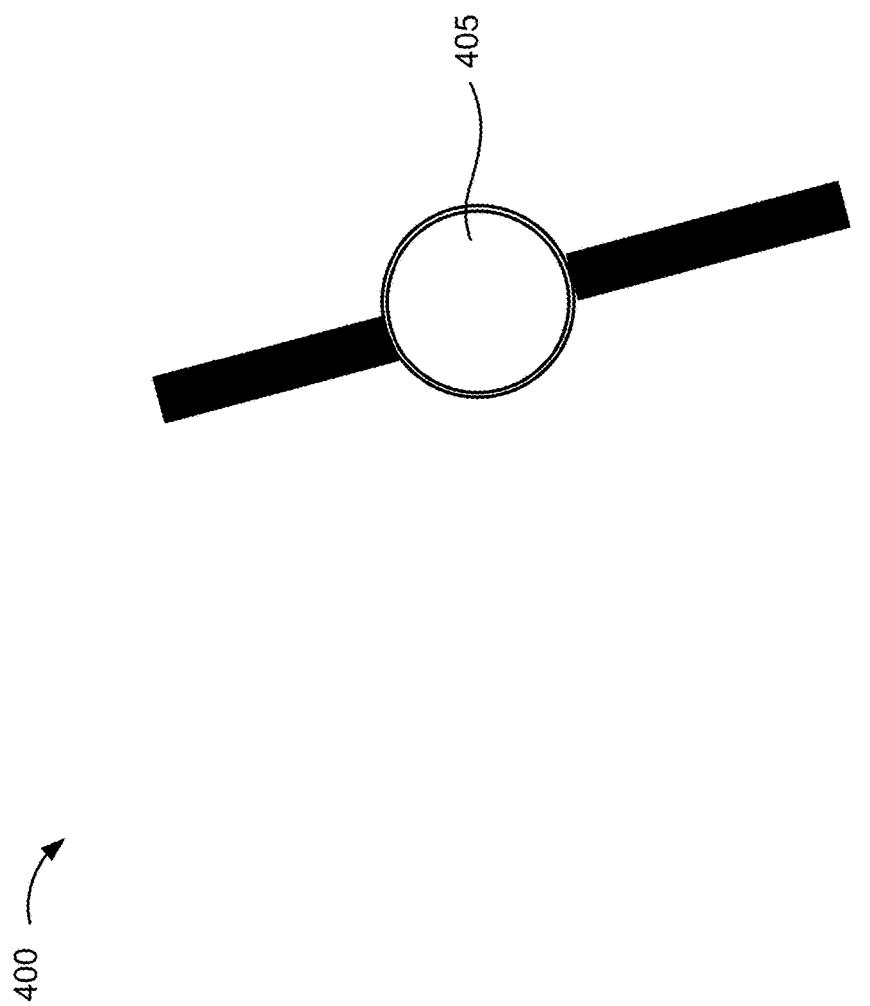
FIG. 4 illustrates another exemplary user device in which an embodiment of the virtual borderless display may be implemented.

FIG. 4 illustrates another example of a user device 400 in which an embodiment of the virtual borderless display may be implemented. In this example, user device 400 is representative of a wearable device (e.g., a watch-type user device) that comprises a circular display 405. Circular display 405 may be implemented based on display configuration 200, as described herein.

Figure 5:
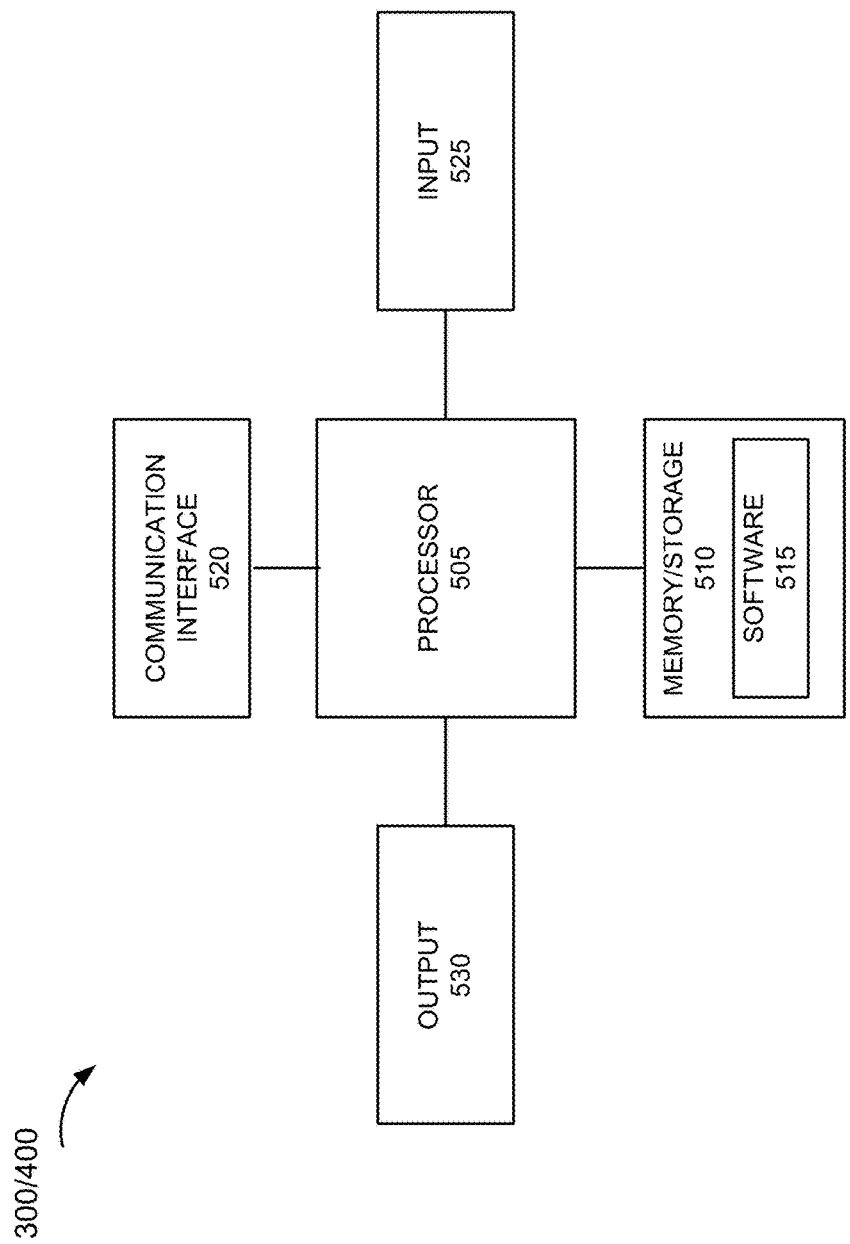
FIG. 5 is a diagram illustrating exemplary components of the user devices depicted in FIGS. 3 and 4.

FIG. 5 illustrates exemplary components of user devices 300 and 400 (simply referred to as user device 300). As illustrated, according to an exemplary embodiment, user device 300 comprises a processor 505, memory/storage 510, software 515, a communication interface 520, an input 525, and an output 530. According to other embodiments, user device 300 may comprise fewer components, additional components, different components, and/or a different arrangement of components than those illustrated in FIG. 5 and described herein.

Processor 505 comprises one or multiple processors, microprocessors, data processors, co-processors, and/or some other type of component that interprets and/or executes instructions and/or data. Processor 505 may be implemented as hardware (e.g., a microprocessor, etc.) or a combination of hardware and software (e.g., a system-on-chip (SoC), an application-specific integrated circuit (ASIC), etc.). Processor 505 performs one or multiple operations based on an operating system and/or various applications or programs (e.g., software 515).

Memory/storage 510 comprises one or multiple memories and/or one or multiple other types of storage mediums. For example, memory/storage 510 may include a random access memory (RAM), a dynamic random access memory (DRAM), a cache, a read only memory (ROM), a programmable read only memory (PROM), and/or some other type of memory. Memory/storage 510 may include a hard disk (e.g., a magnetic disk, an optical disk, a magneto-optic disk, a solid state disk, etc.).

Software 515 comprises an application or a program that provides a function and/or a process. Software 515 may include firmware. By way of example, software 515 may comprise a telephone application, a multi-media application, an e-mail application, a contacts application, a calendar application, an instant messaging application, a web browsing application, a location-based application (e.g., a Global Positioning System (GPS)-based application, etc.), a camera application, etc. Software 515 comprises an operating system (OS). For example, depending on the implementation of user device 300, the operating system may correspond to iOS, Android, Windows Phone, Symbian, or another type of operating system (e.g., proprietary, BlackBerry OS, Windows, Linux, etc.).

Communication interface 520 permits user device 300 to communicate with other devices, networks, systems, etc. Communication interface 520 may include one or multiple wireless interfaces and/or wired interfaces. Communication interface 520 may include one or multiple transmitters, receivers, and/or transceivers. Communication interface 520 operates according to one or multiple protocols, a communication standard, and/or the like.

Input 525 permits an input into user device 300. For example, input 525 may include a button, a switch, a touch pad, an input port, speech recognition logic, and/or a display (e.g., a touch display, a touchless display). Output 230 permits an output from user device 300. For example, output 530 may include a speaker, a display, a light, an output port, and/or some other type of output component.

User device 300 may perform a process and/or a function in response to processor 505 executing software 515 stored by memory/storage 510. By way of example, instructions may be read into memory/storage 510 from another memory/storage 510 or read into memory/storage 510 from another device via communication interface 520. The instructions stored by memory/storage 510 causes processor 505 to perform the process or the function. Alternatively, user device 300 may perform a process or a function based on the operation of hardware (processor 505, etc.).

The foregoing description of embodiments provides illustration, but is not intended to be exhaustive or to limit the embodiments to the precise form disclosed. Accordingly, modifications to the embodiments described herein may be possible.

The terms "a," "an," and "the" are intended to be interpreted to include one or more items. Further, the phrase "based on" is intended to be interpreted as "based, at least in part, on," unless explicitly stated otherwise. The term "and/or" is intended to be interpreted to include any and all combinations of one or more of the associated items.

The terms "comprise," "comprises" or "comprising," as well as synonyms thereof (e.g., include, etc.), when used in the specification is meant to specify the presence of stated features, integers, steps, or components but does not preclude the presence or addition of one or more other features, integers, steps, components, or groups thereof. In other words, these terms are to be interpreted as inclusion without limitation.

The word "exemplary" is used herein to mean "serving as an example." Any embodiment or implementation described as "exemplary" is not necessarily to be construed as preferred or advantageous over other embodiments or implementations.

Spatially relative terms, such as "beneath," "below," "lower," "above," "upper," and the like, may be used herein for ease of description to describe one element's or feature's relationship to another element or feature as illustrated in the figures. For example, if the element in the figure is turned over, an element described as "below" or "beneath" another element or another feature would then be oriented "above" the other element or the other feature. Thus, for example, the exemplary terms "below" or "beneath" may encompass both an orientation of above and below depending on the orientation of a display device or a user device. In the instance that the display device may be oriented in a different manner (e.g., rotated at 90 degrees or at some other orientation), the spatially relative terms used herein should be interpreted accordingly.

In the preceding specification, various embodiments have been described with reference to the accompanying drawings. However, various modifications and changes may be made thereto, and additional embodiments may be implemented, without departing from the broader scope of the invention as set forth in the claims that follow. The specification and drawings are accordingly to be regarded as illustrative rather than restrictive.

In the specification and illustrated by the drawings, reference is made to "an exemplary embodiment," "an embodiment," "embodiments," etc., which may include a particular feature, structure or characteristic in connection with an embodiment(s). However, the use of the phrase or term "an embodiment," "embodiments," etc., in various places in the specification does not necessarily refer to all embodiments described, nor does it necessarily refer to the same embodiment, nor are separate or alternative embodiments necessarily mutually exclusive of other embodiment(s). The same applies to the term "implementation," "implementations," etc.

No element, act, or instruction described in the present application should be construed as critical or essential to the embodiments described herein unless explicitly described as such.

Use of ordinal terms such as "first," "second," "third," etc., in the claims to modify a claim element does not by itself connote any priority, precedence, or order of one claim element over another, but are used merely as labels to distinguish one claim element having a certain name from another element having a same name (but for use of the ordinal term) to distinguish the claim elements.

What is claimed is:

1. A display comprising:
a display panel having a top surface and a bottom surface, wherein the display panel comprises two or more bonding areas on the top surface;
a touch panel operable in at least one of an on-touch mode or a touchless mode, wherein the touch panel has a top surface and a bottom surface, wherein the touch panel and display panel are in a stacked relationship such that the top surface of the display panel is adjacent the bottom surface of the touch panel and a longitudinal axis of the display traverses the touch panel and the display panel;
a driver configured to drive the display panel and the touch panel;
a layer that provides a medium via which signals can propagate to and from the driver, wherein the layer has a top surface and a bottom surface, wherein the layer and display panel are in stacked relationship such that the top surface of the layer is adjacent the bottom surface of the display panel and the longitudinal axis of the display traverses the display panel and the layer, and wherein the driver is mounted to the layer;
two or more display panel flexible connectors each having a first end and a second end, wherein the two or more display panel flexible connectors provide communication paths between the display panel and the driver, and wherein the first end of each of the two or more display panel flexible connectors connects to the display panel at a corresponding one of the two or more bonding areas, and wherein the second end of each of the two or more display panel flexible connectors connects to the bottom surface of the layer thereby connecting to the driver via the layer; and
a touch panel flexible connector, wherein the touch panel flexible connector has a first end connected to the bottom surface of the touch panel and a second end connected to the bottom surface of the layer thereby connecting the touch panel to the driver via the layer, and wherein the touch panel flexible connector has a portion radially outwardly spaced from at least one of the display panel flexible connectors.

2. The display of claim 1, further comprising:
a backlight, wherein the backlight is located between the display panel and the layer, and wherein each of the two or more flexible connectors comprises one of a flexible printed circuit, a chip-on-flex, or a chip-on-foil.

3. The display of claim 1, wherein the layer is located between the second end of each of the two or more display panel flexible connectors and the display panel.

4. The display of claim 1, further comprising:
a main processing system flexible connector, wherein the main processing system flexible connector connects the layer to a main processing system of a user device that comprises the display.

5. The display of claim 1, wherein the layer is one of a chip-on-flex, a printed circuit board, a chip-on-glass, a glass panel, or a flexible printed circuit.

6. A user device comprising:
a display comprising:
a display panel, wherein the display panel comprises two or more bonding areas spaced from each other around a periphery of the display panel and has one of a circular shape that defines a circular area, a rectangular shape that defines a rectangular area, a square shape that defines a square area, or a hexagonal shape that defines a hexagonal area, wherein the two or more bonding areas are located on a top surface of the display panel within the circular area, the rectangular area, the square area, or the hexagonal area;
a driver configured to drive the display panel;
a layer that provides a medium via which signals can propagate to and from the driver, wherein the layer has a top surface and a bottom surface, and wherein the driver is mounted to the bottom surface of the layer; and
two or more flexible connectors that provide communication paths between the display panel and the driver, wherein a first end of each of the two or more flexible connectors connects to the display panel at a corresponding one of the two or more bonding areas, and wherein a second end of each of the two or more flexible connectors connects to the bottom surface of the layer thereby connecting to the driver via the layer;
a memory, wherein the memory stores software; and
a processor, wherein the processor is configured to execute the software.

7. The user device of claim 6, wherein the display further comprises a backlight, and wherein the backlight is located between the display panel and the layer.

8. The user device of claim 6, further comprising:
a touch panel operable in at least one of an on-touch mode or a touchless mode; and
a touch panel flexible connector, wherein the touch panel flexible connector has a first end connected to a bottom surface of the touch panel and a second end connected to the bottom surface of the layer thereby connecting the touch panel to the driver via the layer, and wherein the driver is further configured to drive the touch panel.

9. The user device of claim 6, further comprising:
a flexible connector, wherein the flexible connector connects the layer to a main processing system of the user device.

10. The user device of claim 9, wherein the display panel comprises:
a thin-film transistor layer; and
a color filter layer, and wherein the two or more bonding areas are located on the thin-film transistor layer, and wherein the thin-film transistor layer and the color filter layer have a circular configuration.

11. A touch display comprising:
a touch panel operable in at least one of an on-touch mode or a touchless mode;
a display panel having a base layer and a top layer positioned above the base layer and having the same geometric shape as one another, wherein the base layer has a greater area than an area of the top layer such that a step portion is formed between the base layer and the top layer, and wherein the base layer comprises two or more bonding areas located on area top surface of the base layer;
a driver configured to drive the display panel;
a layer that provides a medium via which signals can propagate to and from the driver, and wherein the driver is mounted to the layer; and
two or more flexible connectors separate from each other, wherein the two or more flexible connectors provide communication paths between the display panel and the driver, and wherein a first end of each of the two or more flexible connectors connects to the display panel at a corresponding one of the two or more bonding areas, and wherein a second end of each of the two or more flexible connectors connects to the driver via the second ends connections to the layer.

12. The touch display of claim 11, further comprising:
a backlight, wherein the backlight is located between the display panel and the layer, and wherein each of the two or more flexible connectors comprises one of a flexible printed circuit, a chip-on-flex, or a chip-on-foil.

13. The touch display of claim 11, further comprising:
a flexible connector, wherein the flexible connector connects the touch panel to the driver via the layer, and wherein the driver is further configured to drive the touch panel; and wherein the display panel comprises:
a thin-film transistor layer, wherein the two or more bonding areas are located on a top surface of the thin-film transistor layer, and the second end of each of the two or more flexible connectors connects to a bottom surface of the layer.

14. The touch display of claim 11, wherein the display panel is one of a liquid crystal display, an organic light-emitting diode display, or an electrophoretic display.

15. The display of claim 1, wherein the display panel is circular and wherein the two or more bonding areas are within a circular area of the circular display panel and include more than two bonding areas circumferentially spaced around the circular display panel for connecting respectively to one of the display panel flexible connectors.

16. The display of claim 1, wherein the driver is mounted to the bottom surface of the layer.

17. The user device of claim 6, wherein the display panel and layer are in stacked relationship and a longitudinal axis of the user device traverses the display panel and the layer.

18. The display of claim 1, wherein the display panel has one of a circular shape that defines a circular area, a rectangular shape that defines a rectangular area, a square shape that defines a square area, or a hexagonal shape that defines a hexagonal area, and wherein the two or more bonding areas are located on the display panel within the circular area, the rectangular area, the square area, or the hexagonal area.

* * * * *